(12) United States Patent
Ing et al.

(10) Patent No.: US 8,454,195 B2
(45) Date of Patent: Jun. 4, 2013

(54) LIGHTING DEVICE, LIGHTING PANEL AND CIRCUIT BOARD THEREOF

(75) Inventors: Wen-Chiun Ing, Taipei County (TW); Wei-Hsin Hou, Taipei (TW); Ching-Cheng Lee, Hsinchu County (TW)

(73) Assignee: Luxingtek, Ltd., Zhubei (TW)

( * ) Notice: Subject to any disclaimer, the term of this patent is extended or adjusted under 35 U.S.C. 154(b) by 336 days.

(21) Appl. No.: 12/881,359

(22) Filed: Sep. 14, 2010

(65) Prior Publication Data

US 2011/0068709 A1 Mar. 24, 2011

Related U.S. Application Data

(60) Provisional application No. 61/243,822, filed on Sep. 18, 2009.

(51) Int. Cl.
*F21S 4/00* (2006.01)
*F21V 21/00* (2006.01)

(52) U.S. Cl.
USPC .................................................. 362/249.01

(58) Field of Classification Search
None
See application file for complete search history.

(56) References Cited

U.S. PATENT DOCUMENTS

| | | | |
|---|---|---|---|
| 5,317,344 A * | 5/1994 | Beaman et al. | 347/237 |
| 5,321,505 A * | 6/1994 | Leddy | 348/383 |
| 5,523,769 A * | 6/1996 | Lauer et al. | 345/1.3 |
| 6,314,669 B1 * | 11/2001 | Tucker | 40/448 |
| 6,393,685 B1 * | 5/2002 | Collins | 29/416 |
| 6,634,124 B1 * | 10/2003 | Bierschbach | 40/452 |
| 6,690,341 B2 * | 2/2004 | Tokimoto et al. | 345/55 |
| 6,791,513 B2 * | 9/2004 | Ogino et al. | 345/55 |
| 6,817,123 B2 * | 11/2004 | Okazaki et al. | 40/452 |
| 6,956,541 B2 * | 10/2005 | McClintock | 345/1.1 |
| 7,004,611 B2 * | 2/2006 | Parker et al. | 362/606 |
| 7,064,673 B1 * | 6/2006 | Bonham | 340/815.4 |
| 7,221,104 B2 * | 5/2007 | Lys et al. | 315/291 |
| 7,777,699 B2 * | 8/2010 | Varrin et al. | 345/76 |
| 7,888,884 B2 * | 2/2011 | Ye et al. | 315/291 |
| 8,138,617 B2 * | 3/2012 | Poo et al. | 257/690 |
| 8,232,745 B2 * | 7/2012 | Chemel et al. | 315/308 |
| 2004/0223207 A1 * | 11/2004 | Warner et al. | 359/265 |
| 2006/0239001 A1 * | 10/2006 | Mandler et al. | 362/247 |
| 2007/0188427 A1 * | 8/2007 | Lys et al. | 345/82 |
| 2008/0024387 A1 * | 1/2008 | Maskeny et al. | 345/1.1 |
| 2008/0204619 A1 * | 8/2008 | Saitou et al. | 349/43 |
| 2008/0231567 A1 * | 9/2008 | Van de Ven et al. | 345/83 |
| 2008/0244944 A1 * | 10/2008 | Nall et al. | 40/544 |

* cited by examiner

*Primary Examiner* — Lisa Lea Edmonds
*Assistant Examiner* — Xanthia C Cunningham
(74) *Attorney, Agent, or Firm* — Skaar Ulbrich Macari, P.A.

(57) ABSTRACT

A lighting device, a lighting panel and a circuit board thereof are provided. The circuit board comprises a substrate; a plurality of light sources disposed on the substrate and at least one circuit layer, being patterned onto the substrate to form a plurality of traces for electrically connecting the light sources. Therein, the circuit board is capable of being assembled with other circuit boards to construct the lighting panel. The lighting device is capable of having the lighting panel of a large size by assembling a plurality of the circuit boards and individually controlling each light source disposed on the lighting panel so as to provide the function of local dimming.

18 Claims, 22 Drawing Sheets

LIGHTING DEVICE, LIGHTING PANEL AND CIRCUIT BOARD THEREOF

PRIORITY

This application claims priority benefit of U.S. Provisional Patent Application Ser. No. 61/243,822, filed Sep. 18, 2009, which is hereby incorporated herein by reference in its entirety.

FIELD

The present invention relates to a lighting device, a lighting panel and a circuit board thereof, and more particularly, relates to a lighting device including a large size lighting panel constructed by assembling a plurality of circuit boards.

BACKGROUND

The conventional direct-lit backlight module used for a display comprises a plurality LEDs and is directly disposed onto a display panel. The current commercial available LED die bonder and wire bonder have very narrow limitation of the sample holder size, which can only adapt PCB substrate or other substrates no larger than the width equal to 60 mm and the length equal to 250 mm. Therefore, for a final lighting device at A4 size, i.e. 210 mm×300 mm, or larger, a method for the panelization of a multiple PCB substrates becomes necessary. Given the above, a lighting device with a large size lighting panel needs to be developed in this field.

SUMMARY

Objectives of certain embodiments of include providing a lighting device with a large size lighting panel constructed by assembling a plurality of circuit boards. Therefore the lighting panel of the lighting device can be panelized to have an unlimited size configuration and perform the function of local dimming.

According to certain embodiments, a circuit board is disclosed, comprising a substrate, a plurality of light sources disposed on the substrate and a circuit layer. The circuit layer is patterned onto the substrate to form a plurality of traces for electrically connecting the light sources. The circuit board is capable of being assembled with other circuit boards to construct a lighting panel. Therefore, by assembling the circuit boards, a lighting panel with a large size configuration can be manufactured.

A lighting device is further disclosed, comprising a lighting panel, and a controller. The lighting panel comprises a plurality of aforementioned circuit boards. The circuit boards are assembled into an N×M array. The controller is electrically connected to the lighting panel to individually control the light sources through the traces. Therefore, the controller of the lighting device is capable of selectively activating each of the light sources through the traces according to the displayed image to achieve the objective of local dimming.

The detailed technology and preferred embodiments implemented for the subject invention are described in the following paragraphs accompanying the appended drawings for people skilled in this field to well appreciate the features of the claimed invention. It is understood that the features mentioned hereinbefore and those to be commented on hereinafter may be used not only in the specified combinations, but also in other combinations or in isolation, without departing from the scope of the present invention.

DETAILED DESCRIPTION

In the following descriptions, the present invention will be explained with reference to various example embodiments; nevertheless, these embodiments are not intended to limit the present invention to any specific environment, embodiment, example, applications, or particular implementations described in these example embodiments. Therefore, descriptions of these example embodiments are only provided for the purpose of illustration, not to limit the present invention. It should be appreciated that elements unrelated directly to the present invention may be omitted from the example embodiments and the attached drawings.

Figure 1:
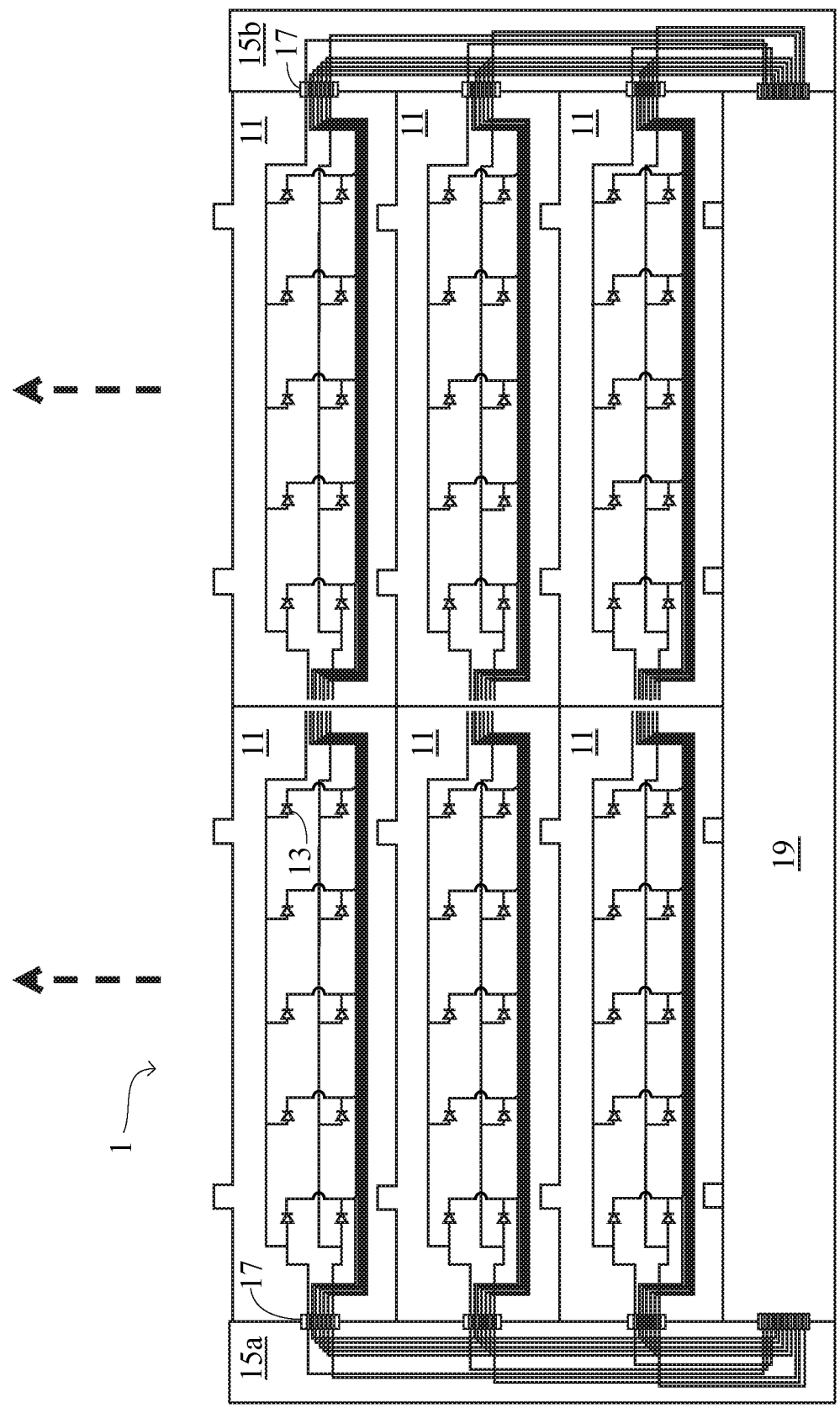
FIG. 1 is the top view illustrating the lighting device in accordance with a first embodiment of the present invention.

Certain embodiments of the present invention relate to a lighting device, for example, a lighting device used as a direct-lit backlight module for a display. FIG. 1 illustrates the top view illustrating the lighting device 1 in accordance with the first embodiment of the present invention. The lighting device 1 comprises a lighting panel comprising a plurality of circuit boards 11, a plurality of light sources 13, two bars 15a, 15b assembled at two side of the lighting panel, a plurality of connectors 17, and a controller 19. The connectors 17 are disposed onto the bars 15a, 15b. Each of the circuit boards 11 are electrically connected to one of the bars 15a, 15b via one of the connectors 17. The controller 19 is electrically connected to the bars 15a, 15b via two of the connectors 17 to individually control the light sources 13. The circuit boards of the lighting panel are assembled into an N×M array.

Each of the circuit boards 11 has a substrate 11a with a top surface and a bottom surface, the light sources 13 and a circuit layer. The substrate 11a can be a printed circuit board (PCB) or a flexible printed circuit board (FPC). Alternatively, the substrate 11a can also be made of plastic, glass, ceramic or polymer composites. The circuit layers are patterned onto the top surface and the bottom surface of the substrate 11a to form a plurality of traces for electrically connecting the light sources 13 disposed on the top surface of the substrate 11a. The circuit layer with the traces can be made of Cu, Ag, Ni, Au or Al.

In this embodiment, the circuit boards 11 are assembled into N-by-2 array, i.e. the N rows and 2 columns, without limited length along the column direction so as to manufacturing a large size lighting panel. In other words, the lighting panel in this embodiment is assembled from 2N circuit boards, however in other embodiments, the lighting panel may contains three or more columns of the circuit boards 11.

The substrate 11a of each of the circuit boards 11 comprises at least one tenon and at least one mortise to assemble the circuit board 11 with the other circuit boards 11 by jointing the at least one tenon and the at least one mortise of the circuit board 11 into the at least one mortise and the at least one tenon of the other circuit boards 11, respectively. Further to that the circuit boards 11 are assembled by using tenons and mortises in the column direction, the circuit boards 11 are fixed by the connector 17 in the row direction.

In this embodiment, each of the circuit boards 11 is electrically connected to one of the connectors 17 disposed onto one of the bars 15a, 15b via the traces. More specifically, the circuit boards 11 can be directly plugged to the connectors 17 with no additional soldering required. By the control circuit formed with the traces which are individually connected to the light sources 13, the controller 19 can individually control the light sources 13 so as to perform the function of local dimming.

The light sources 13 can be LED dies or LED packages with encapsulant, which are wire bonded or flip chip bonded to electrically connect to the traces of the circuit boards 11. The encapsulant includes any conventional glue being dispensed on to the LED dies to enclosed and protect the LED dies. The encapsulant could be made of transparent or semi-transparent polymer resins such as polyurethane based polymer, epoxy based polymer, silicon based polymer, acrylic polymer, polyethylene, polystyrene, polycarbonate, PMMA, ABS, thermal curable material, or UV curable material. The encapsulant could also be made of transparent polymer materials containing light scattering particles such as titanium dioxide particles, calcium carbonate particles, silica oxide particles, polymeric particles with differentiable refractive index, air micro-voids or the combination thereof. Alternatively, the encapsulant could be made of a phosphor material for converting UV, blue or other color light emitted from the LED dice into white light.

Figure 2:
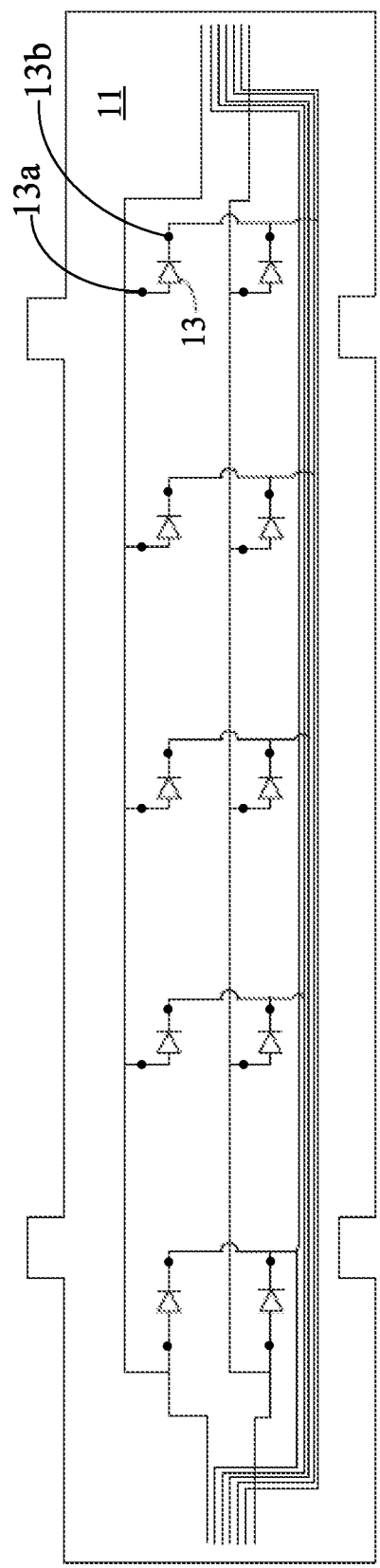
FIG. 2 is the top view illustrating the circuit board of lighting device in accordance with the first embodiment.

FIG. 2 is the top view illustrating one of the circuit boards 11 of lighting device 1 in accordance with the first embodiment. Each of the light sources 13 has a power terminal 13a and a ground terminal 13b. The light sources 13 of the circuit boards 11 are disposed into an array, and the light sources 13 laid in a same row are electrically connected to each other at the power terminals 13a of the light sources 13 and the light sources 13 laid in a same column are electrically connected to each other at the ground terminals 13b of the light sources 13. In other embodiments, the light sources 13 laid in a same row may be electrically connected to each other at the ground terminals 13b of the light sources 13 and the light sources 13 laid in a same column may be electrically connected to each other at the power terminals 13a of the light sources 13. Therefore, the controller 19 are capable of selectively activating one of light sources 13 by applying a voltage difference between the trace connected to the power terminal 13a of the selected source 13 and the trace connected to the ground terminal 13b of the selected source 13 according to the displayed image to achieve the objective of local dimming.

In this embodiment, each of the circuit boards 11 contains two rows of the light sources 13. However, in other embodiment, each of the circuit boards 11 may contain one or more than two rows of the light sources 13.

Figures 3A, 3B:
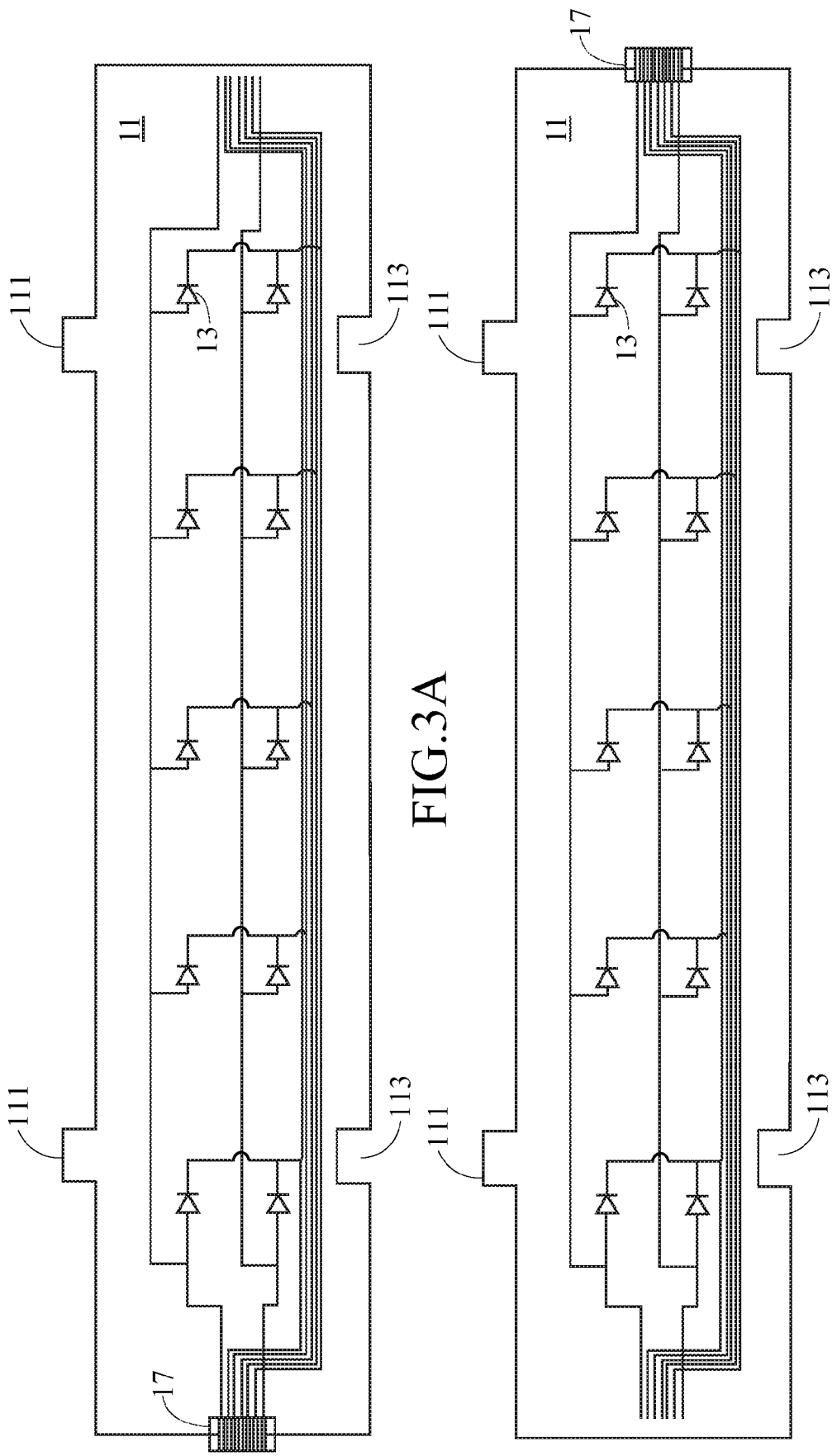
FIGS. 3A and 3B are the top views illustrating the circuit boards adapted to be plugged into the connectors of the lighting device in accordance with the first embodiment.
Figure 4:
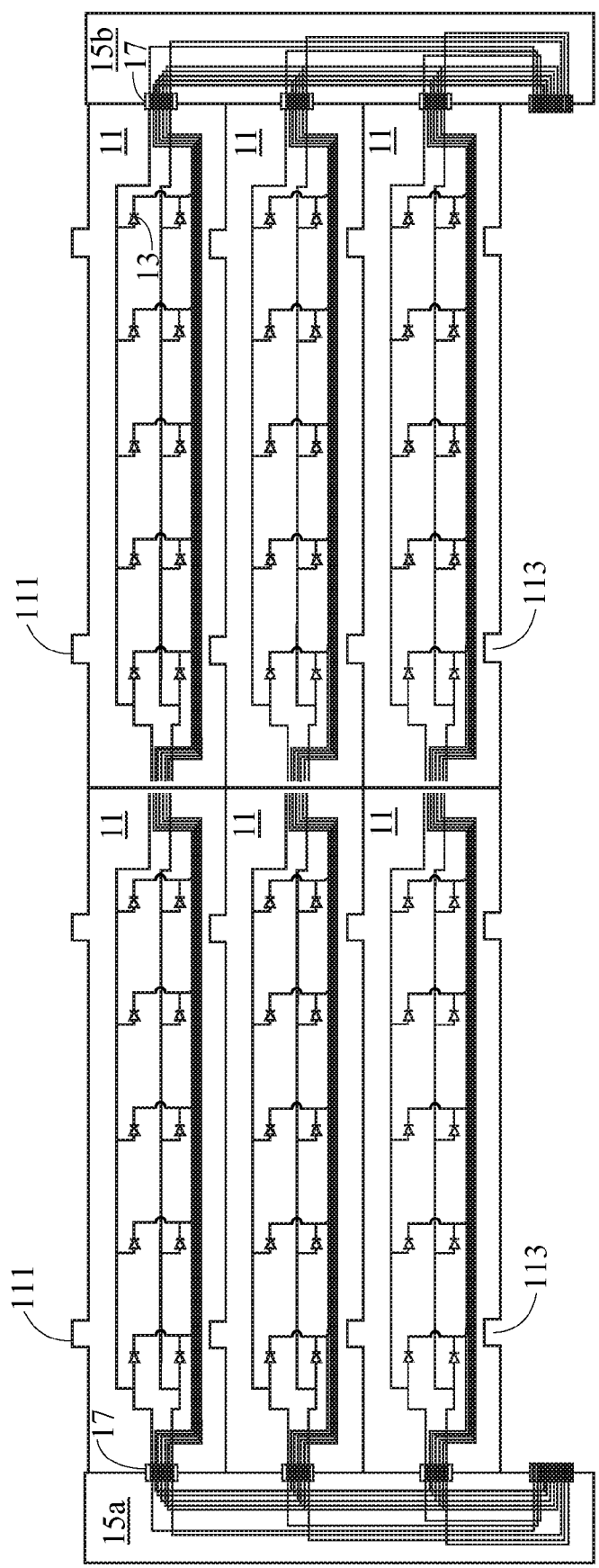
FIG. 4 is the top view illustrating that the circuit boards have been plugged into the connectors of the bars in accordance with the first embodiment.

FIGS. 3A and 3B are the top views illustrating the circuit boards 11 adapted to be plugged into the connectors 17 of the lighting device 1 in accordance with the first embodiment. The circuit boards 11 can be selectively and directly plugged to the connectors 17 on both sides, i.e. the left side and the right side, thereof. FIG. 4 is the top view illustrating that the circuit boards 11 have been plugged to the connectors 17 of the bars 15a, 15b in accordance with the first embodiment.

Figure 5:
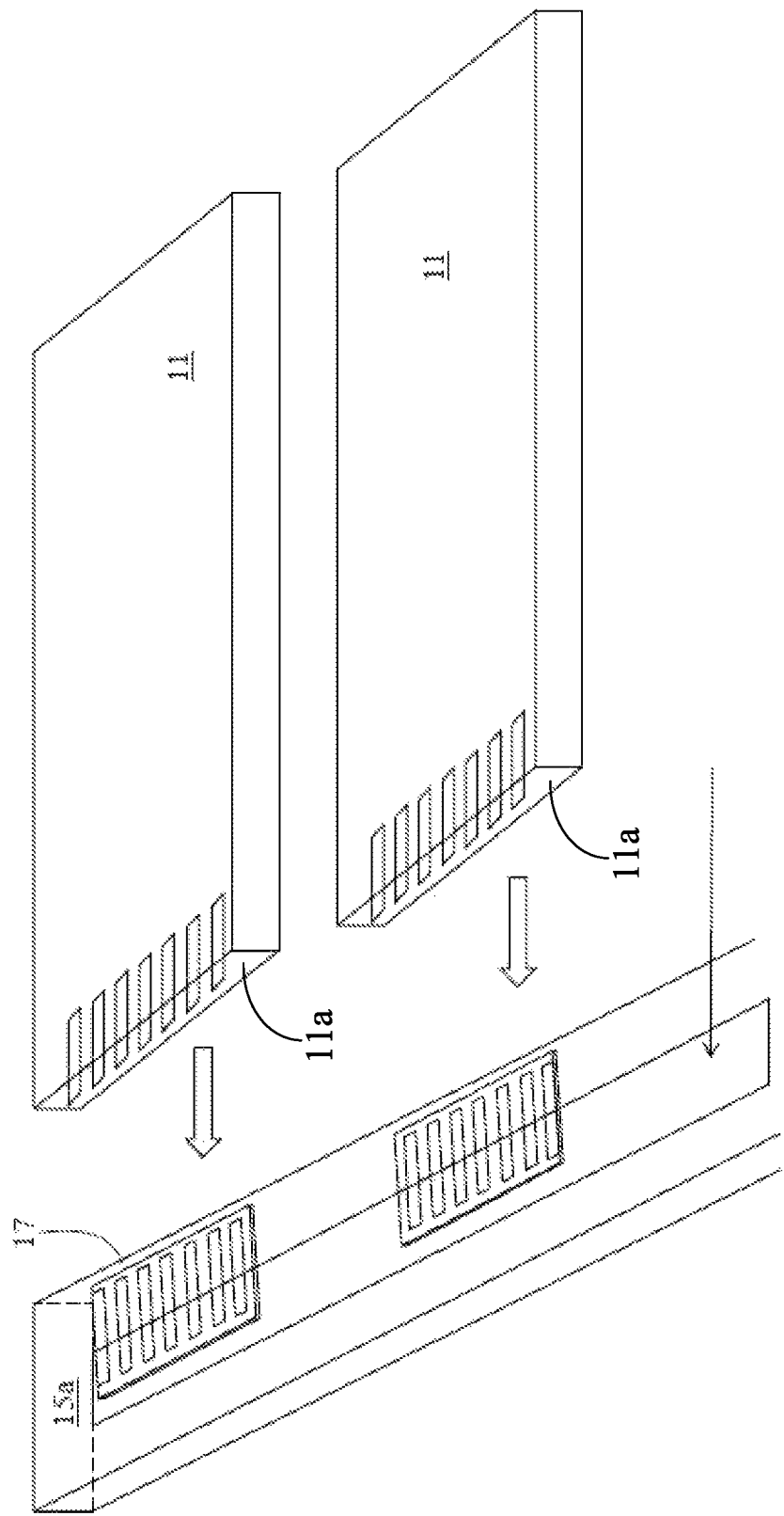
FIG. 5 is a perspective views illustrating the circuit boards plugged to the connectors of one of the bar in accordance with the first embodiment.
Figure 6:
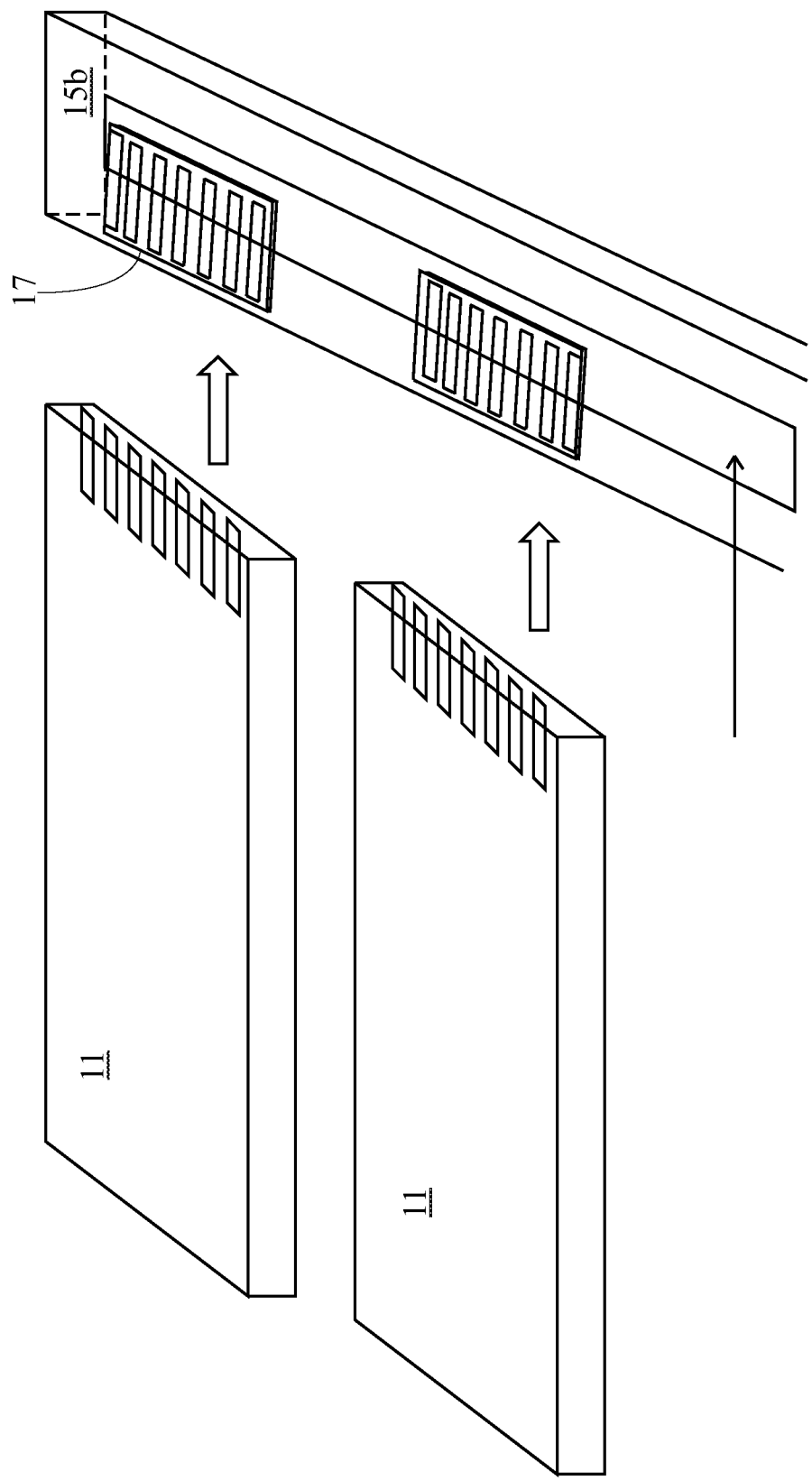
FIG. 6 is another perspective view illustrating the circuit boards plugged to the connectors of another of the bars in accordance with the first embodiment.

FIG. 5 is a perspective view illustrating the circuit boards 11 plugged to the connectors 17 of the left bar 15a in accordance with the first embodiment. Therein, the circuit boards 11 are plugged to the connector 17 on the left side thereof. Alternately, FIG. 6 is another perspective view illustrating the circuit boards 11 plugged to the connector 17 of the right bar 15b in accordance with the first embodiment on the right side thereof.

Figure 7:
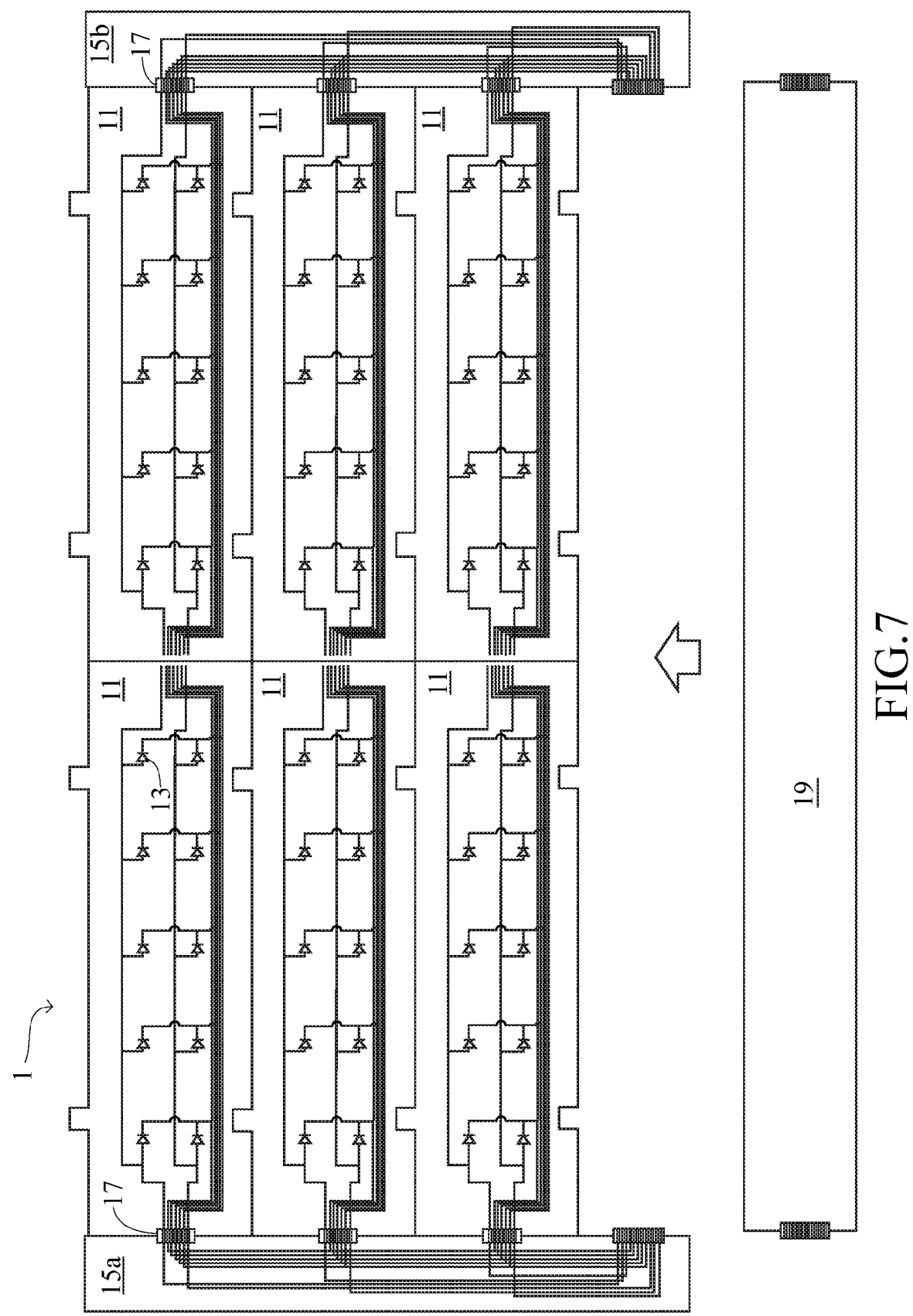
FIG. 7 is the schematic view illustrating the controller before being plugged to the connectors of the bars in accordance with the first embodiment.
Figure 8:
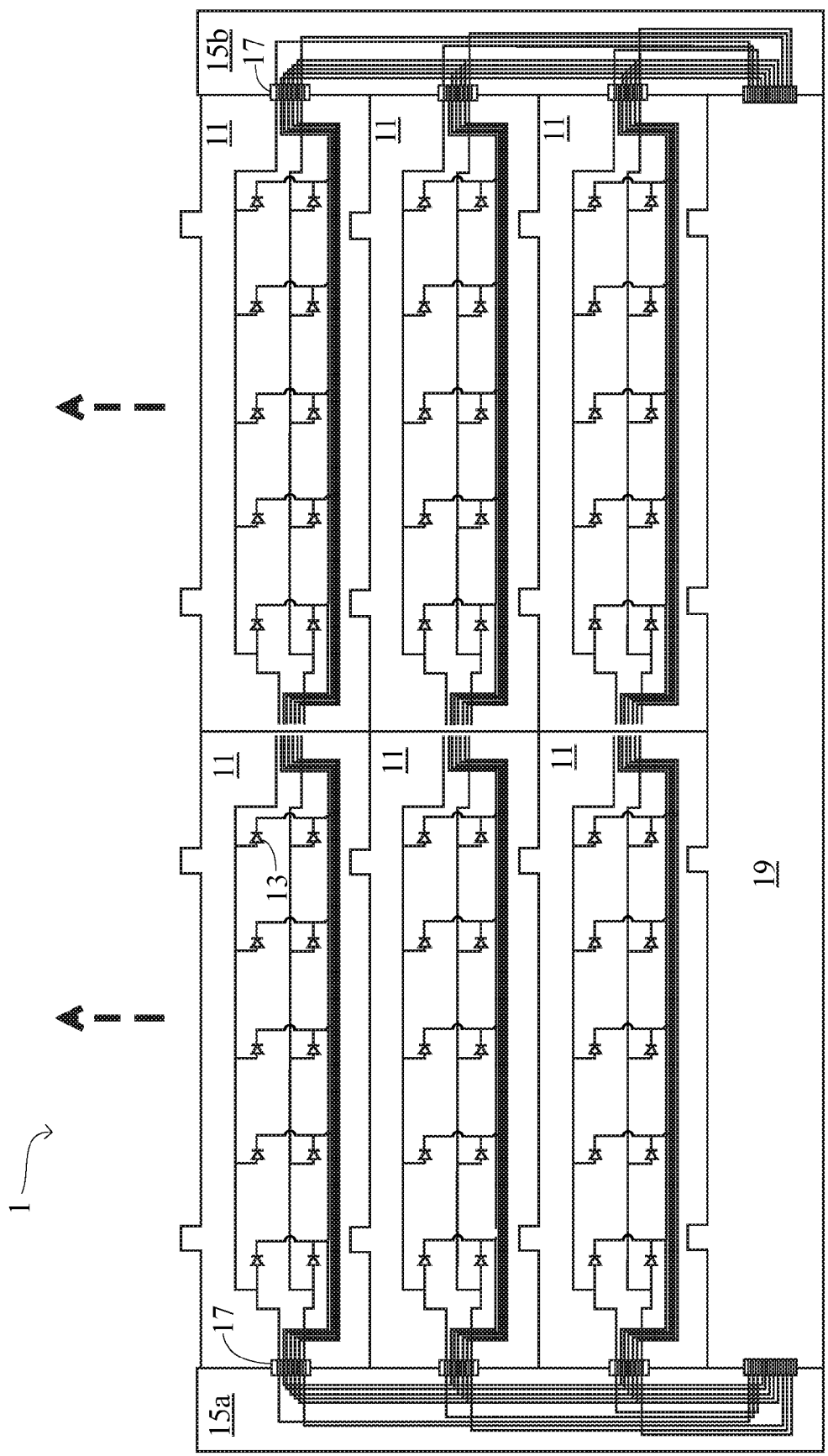
FIG. 8 is the schematic view illustrating the controller after being plugged to the connectors of the bars in accordance with the first embodiment.

FIG. 7 is the schematic view illustrating the controller 19 before being plugged into the connectors 17 disposed on the bar 15a, 15b of the lighting device 1. Afterwards, FIG. 8 is the schematic view illustrating the controller 19 after being plugged to the connectors 17 disposed on the bars 15a, 15b of the lighting device 1.

Figure 9:
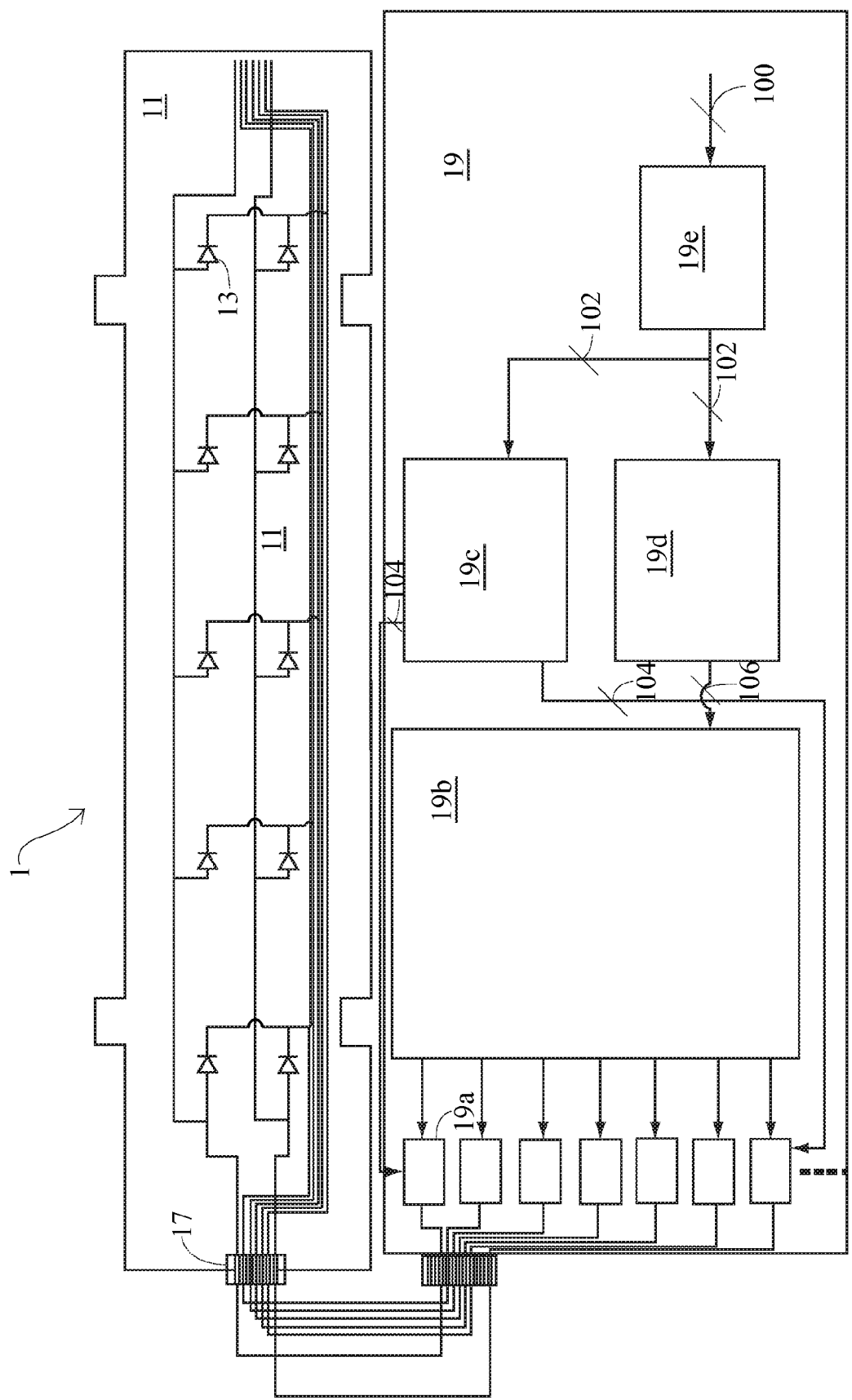
FIG. 9 is the schematic block view illustrating the controller of the lighting device in accordance with the first embodiment.
Figure 10A:
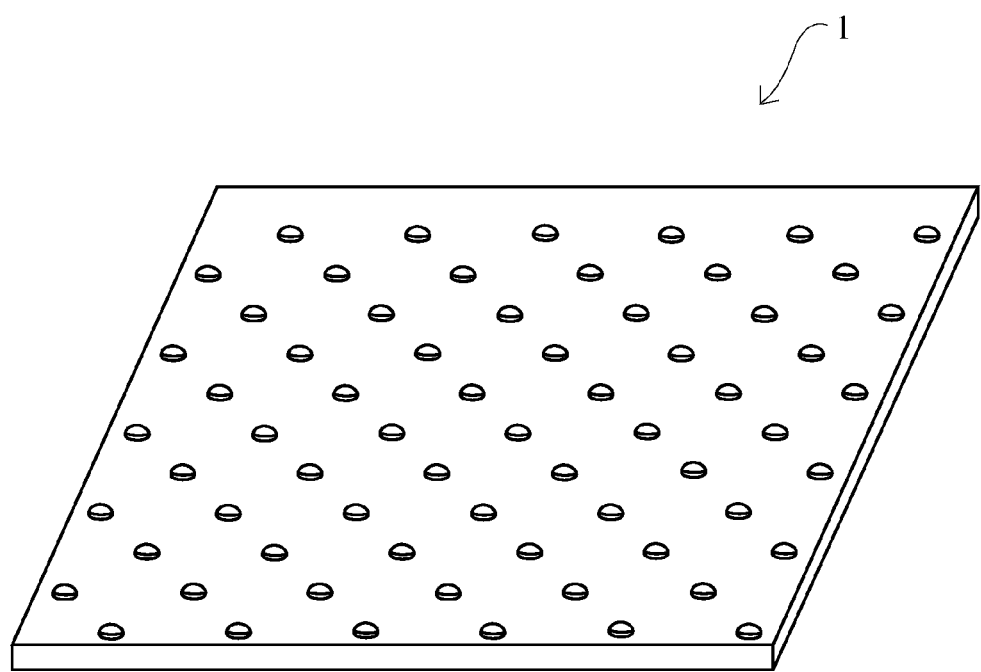
FIGS. 10A to 10D are the schematic views illustrating light spreading plates applied to the lighting device of the present invention.
Figure 10B:
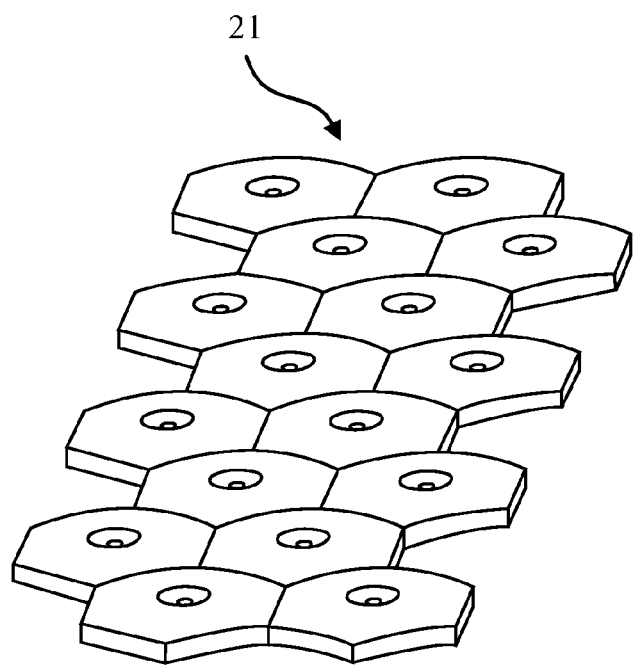
Figure 10C:
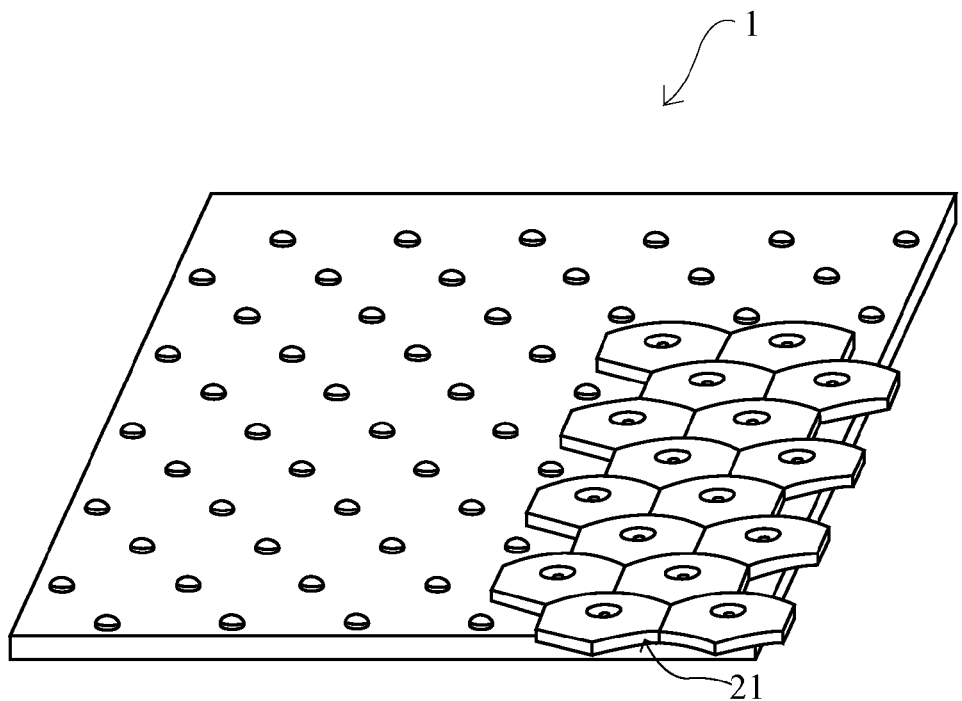
Figure 10D:
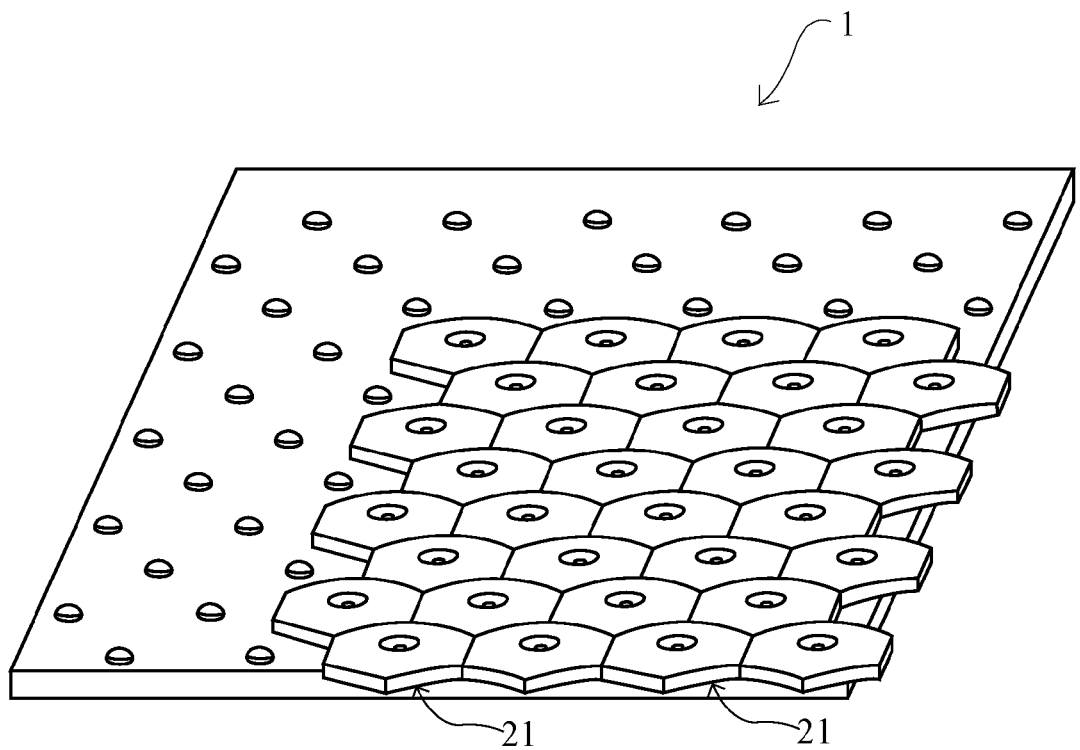

FIG. 9 is the schematic block view illustrating the controller 19 of the lighting device 1 in accordance with the first embodiment. The controller 19 comprises a plurality of switches (SW) 19a, a control IC 19b, DC generating unit 19c, 19d and an AC adapter 19e. The AC adapter 19e is configured to receive an AC voltage 100 from 100 V to 240 V, and to convert the AC voltage 100 to a DC voltage 102 for the DC generating unit 19c, 19d. Afterwards, the DC generating unit 19c provides a DC voltage 104 to SWs 19a for all light sources 13, where the value of the DC voltage 104 is dependent on the characteristics and the target luminance of light sources 13. Furthermore, the DC generating unit 19d provides a DC voltage 106 from 2.2 V to 2.5 V for the control IC 19b to work. The control IC 19b is configured to control the SWs 19a on/off to provide the DC voltage 104 to light sources 13 via the traces in parallel so as to selectively activate the light sources 13 through the traces to achieve the objective of local dimming. In other embodiments, the light sources 13 in the same row may be electrically connected together in series.

FIGS. 10A to 10D are the schematic views illustrating the lighting device 1 further comprising a plurality of light spreading plates 21 disposed on the lighting panel for spreading the light emitting from the light sources 13 to provide a uniform surface light within an ultra thin configuration. The details of the light spreading plates 21 are described in U.S. patent application Ser. No. 12/879,173. Furthermore, the lighting device 1 can further applied to any backlight module, for example the novel lighting device described in U.S. patent application Ser. No. 12/501,592.

Figure 11:
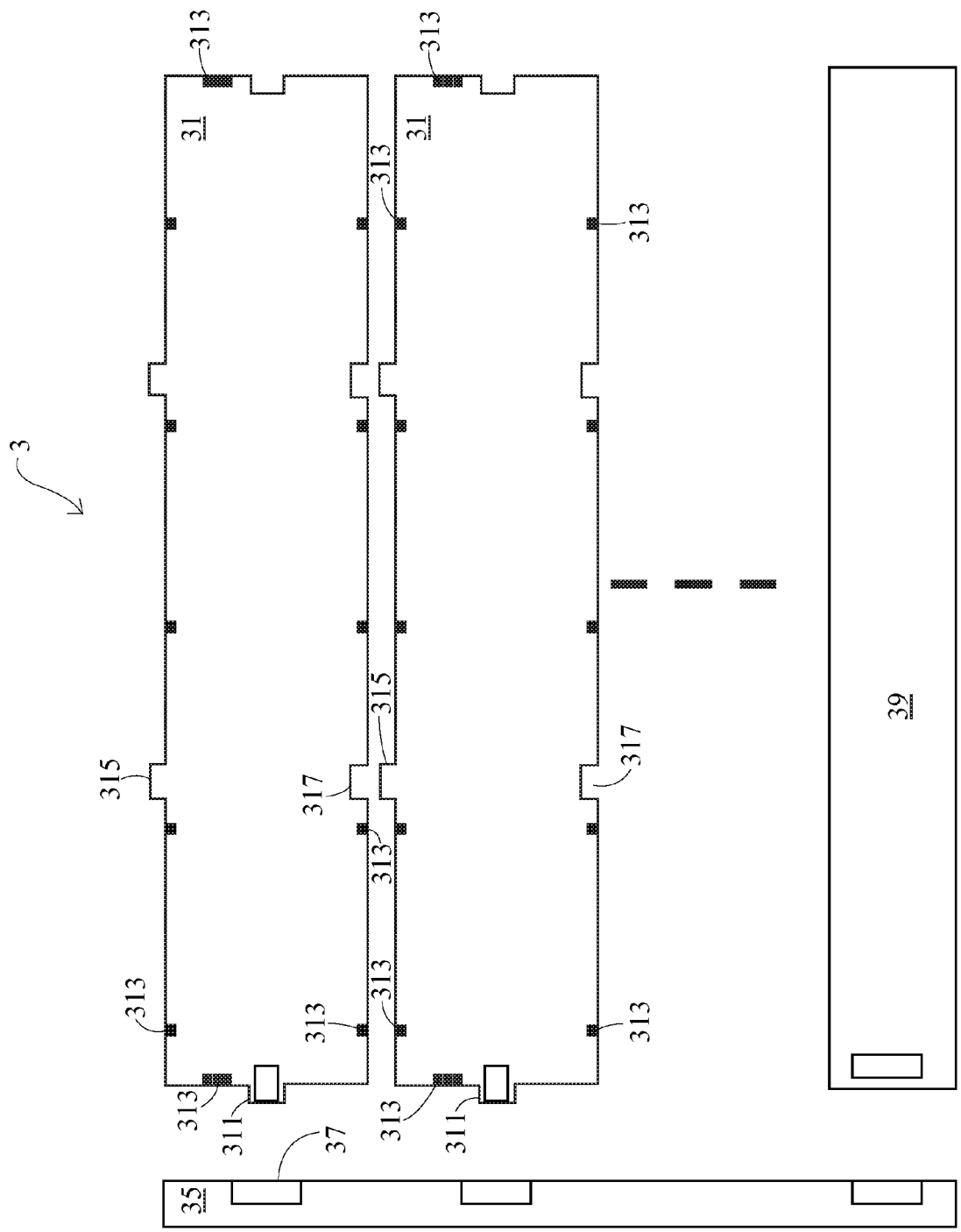
FIG. 11 is the top view illustrating the lighting device in accordance with a second embodiment of the present invention.

FIG. 11 is the top view illustrating the lighting device 3 in accordance with a second embodiment of the present invention. The lighting device 3 comprises a lighting panel assembled with a plurality of circuit boards 31, at least one bar 35, a plurality of connectors 37, and a controller 39. Each of the circuit boards 31 has a flange 311 on the left side thereof for plugging into the corresponding connector 37 disposed on the bar 35, however in other embodiment the flange 311 can be formed on the right side depend on the bar 35 being set on the right side or left side of the lighting panel. In addition, each of the circuit boards 31 comprises a plurality of contact pads 313 formed on a right side, a left side, an up side and a down side of the substrate 11a to electrically connect to the circuit layer via the traces, and the contact pads 313 of the circuit board 31 are electrically connect to corresponding contact pads 313 of the other circuit boards 31 when the circuit board 31 is assembled with the other circuit boards 31.

Figure 12A:
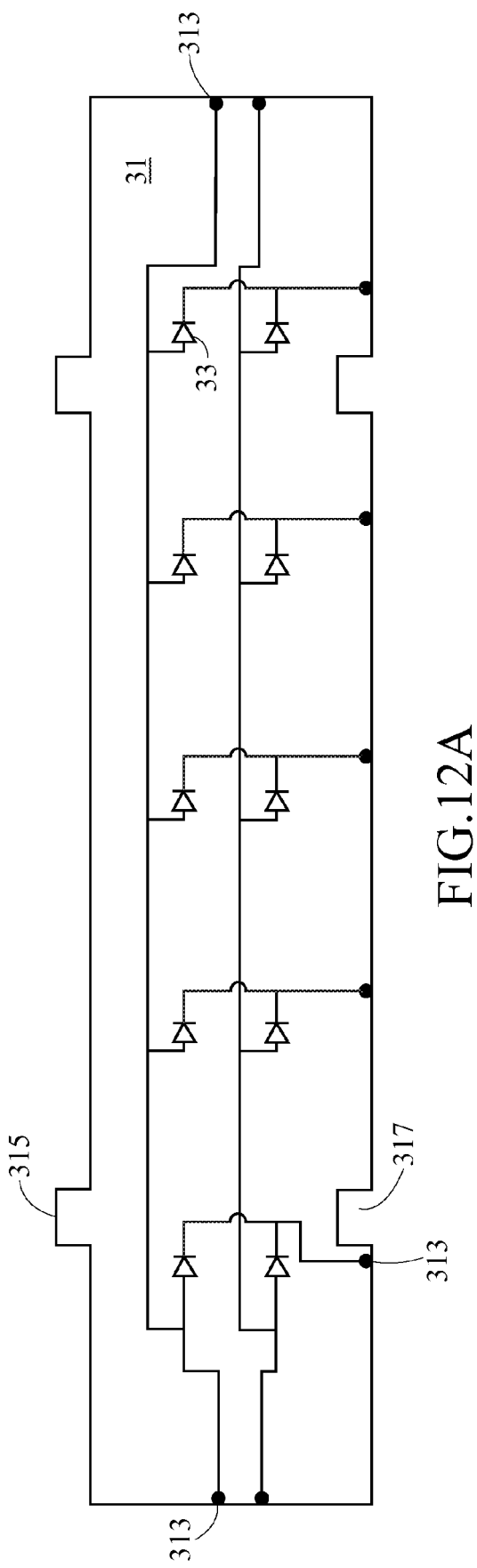
FIGS. 12A and 12B are the top view and bottom view respectively illustrating one of the circuit boards of the lighting device in accordance with the second embodiment.
Figure 12B:
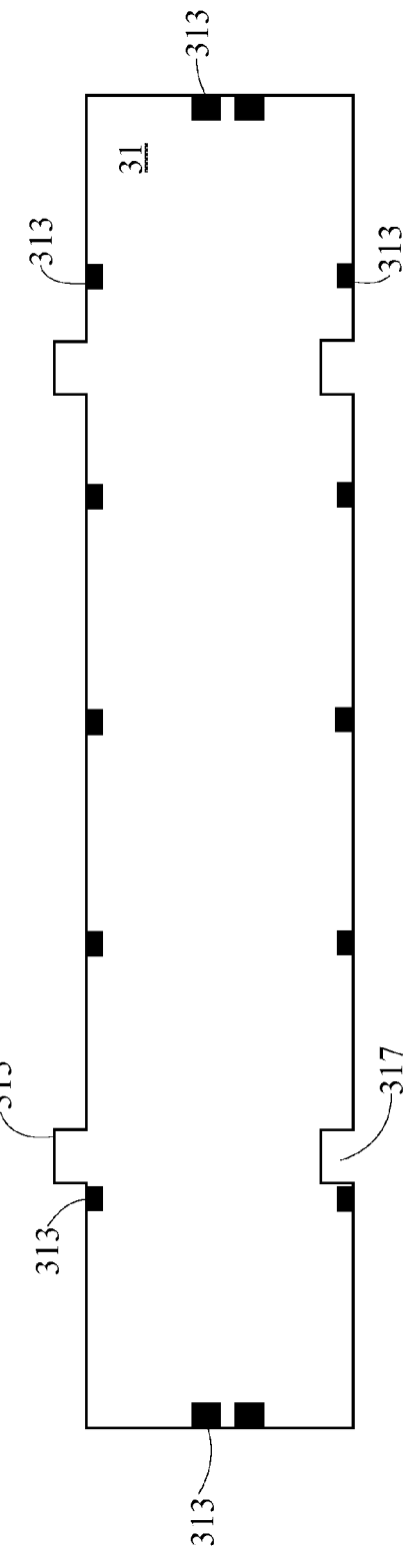

FIGS. 12A and 12B are the top view and bottom view respectively illustrating the circuit boards 31 of lighting device 3 in accordance with the second embodiment. Different from the first embodiment, the circuit boards 31 are assembled by using tenons 315 and mortises 317 thereon. Furthermore, the configuration of the traces of the circuit boards 31 in second embodiment is different from the first embodiment. The light sources 33 in a same row are connected to each other at the power terminals 13a and further connected to one of the contact pads 313. The light sources 33 in a same column are connected to each other at the ground terminals 13b and further connected to another one of the contact pads 313.

Figure 13:
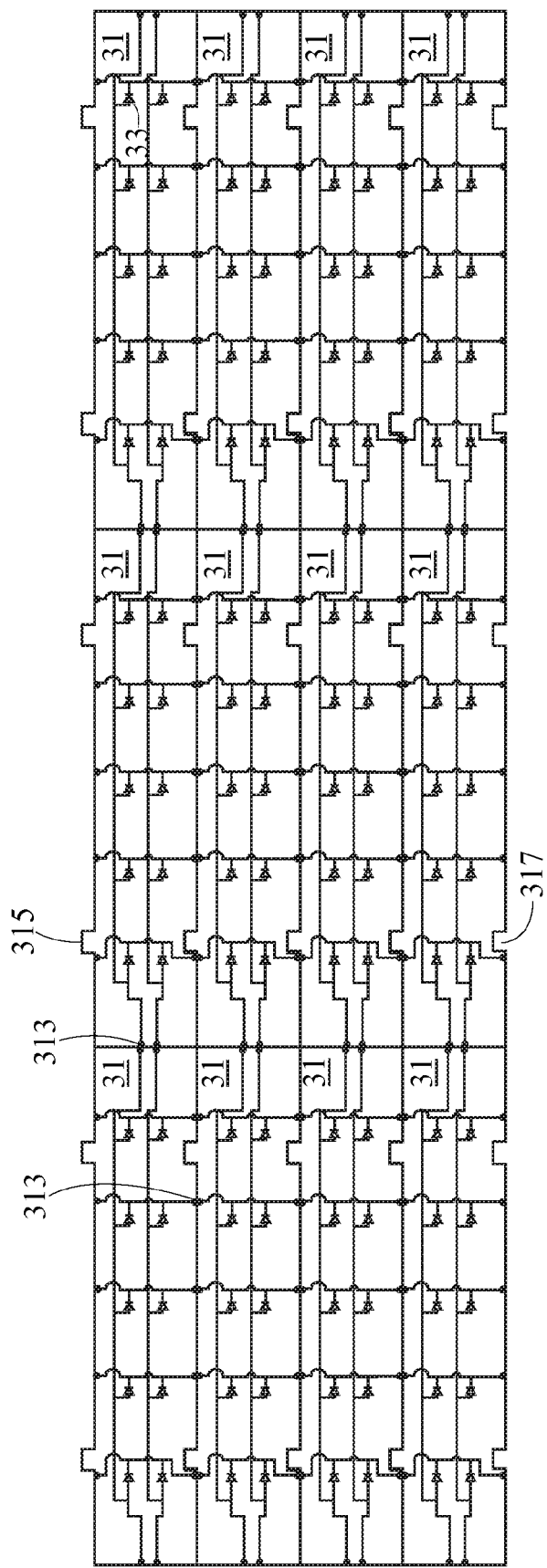
FIG. 13 is the top view illustrating the lighting panel of lighting device in accordance with the second embodiment.

FIG. 13 is the top view illustrating the lighting panel of lighting device 3 in accordance with the second embodiment. As shown in FIG. 13, all of the light sources 33 in a same row of the different circuit boards 31, which are in a same row of the lighting panel, are connected to each other at the power terminals 13a via corresponding contact pads 313 of the circuit boards 31, and all of the light sources 33 in a same column of the different circuit boards 31, which are in a same column of the lighting panel, are connected to each other at the ground terminals 13b via corresponding contact pads 313 of the circuit boards 31. Therefore, the controller 39 are capable of selectively activating one of light sources 33 by applying a voltage difference between the trace connected to the power terminal 13a of the selected source 13 and the trace connected to the ground terminal 13b of the selected source 13 according to the displayed image to achieve the objective of local dimming.

Figure 14:
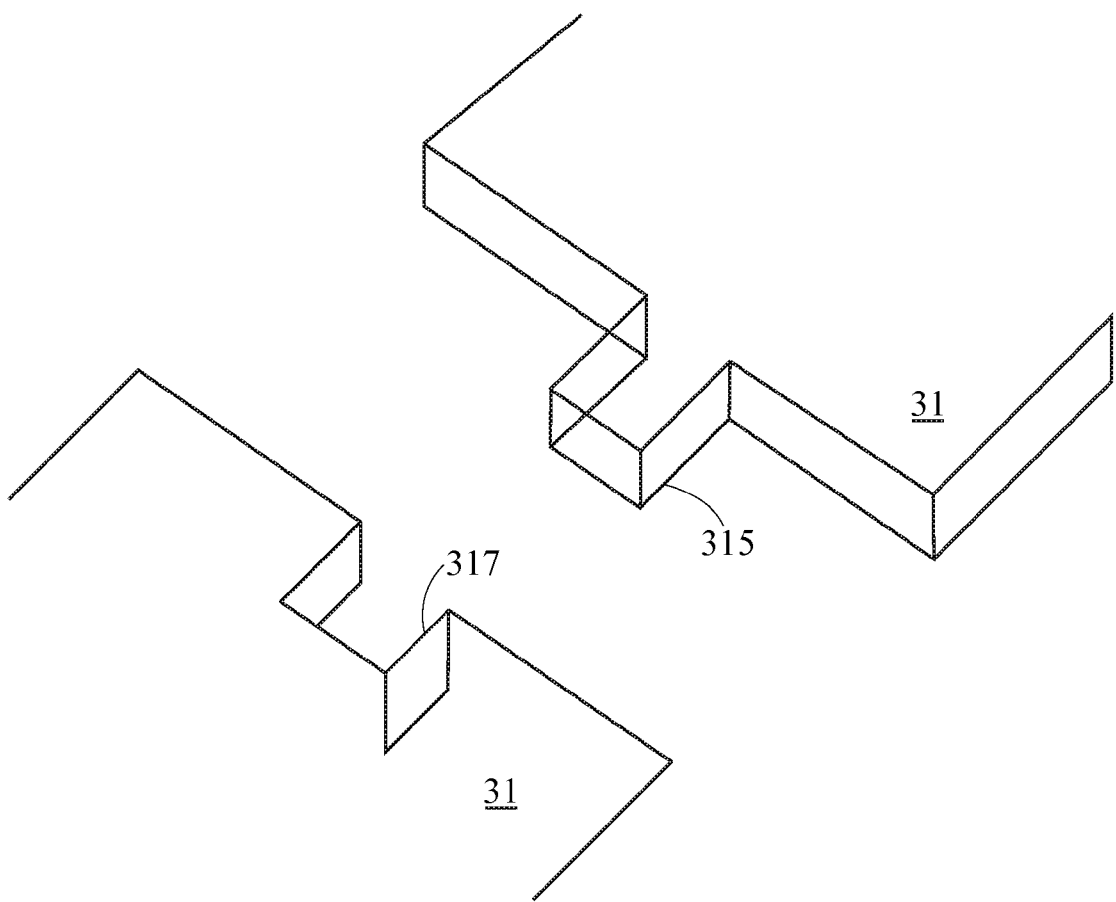
FIG. 14 is the schematic view illustrating the mechanical engagement between the circuit boards.
Figure 15:
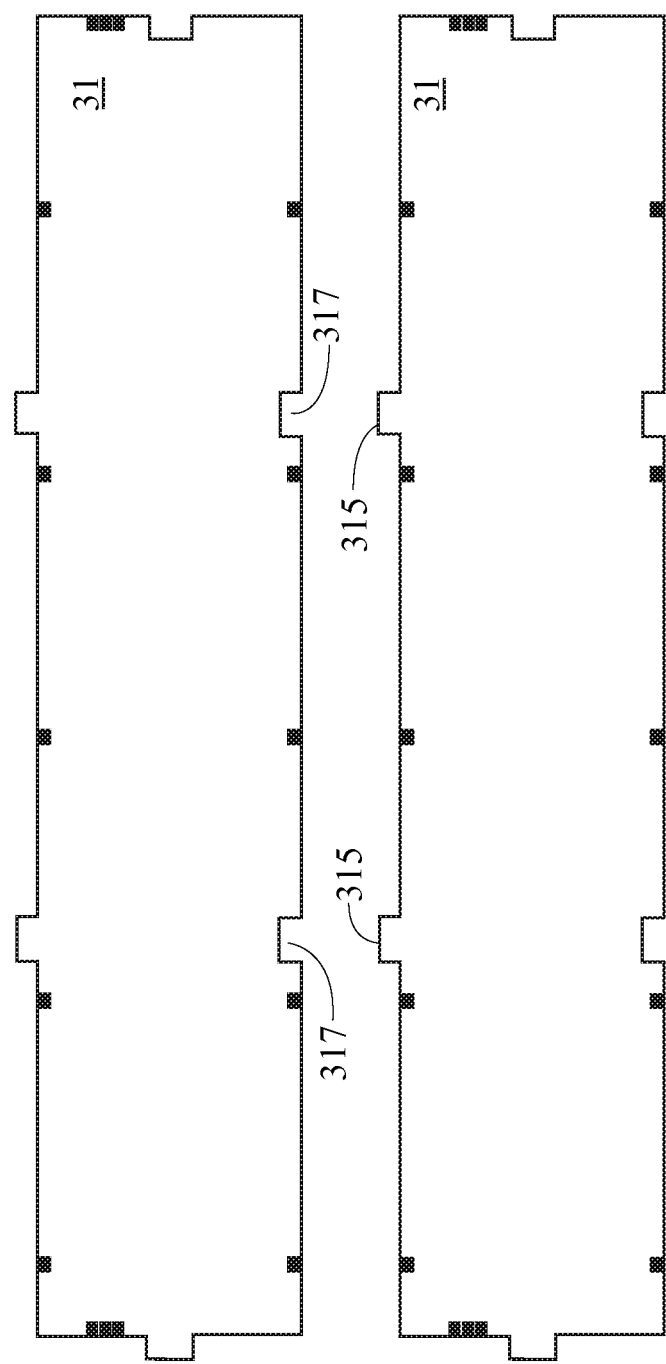
FIG. 15 is the bottom view illustrating the two circuit boards before being assembled together in accordance with the second embodiment.

FIG. 14 is the schematic view illustrating the mechanical engagement between the circuit boards 31. The substrate 11a of each of the circuit boards 31 further comprises at least one tenon 315 and at least one mortise 317. The mechanical engagement between the circuit boards 31 is established by using tenons 315 and mortises 317 formed on the substrate 11a of each of the circuit boards 31. To assemble each of the circuit board 31 with the other circuit boards 31, the tenons 315 and the mortises 317 of the circuit board 31 is jointed into the mortise 317 and the tenon 315 of the other circuit boards 31, respectively. Moreover, two of the circuit boards 31 which haven't been assembled yet are shown in FIG. 15.

Figure 16:
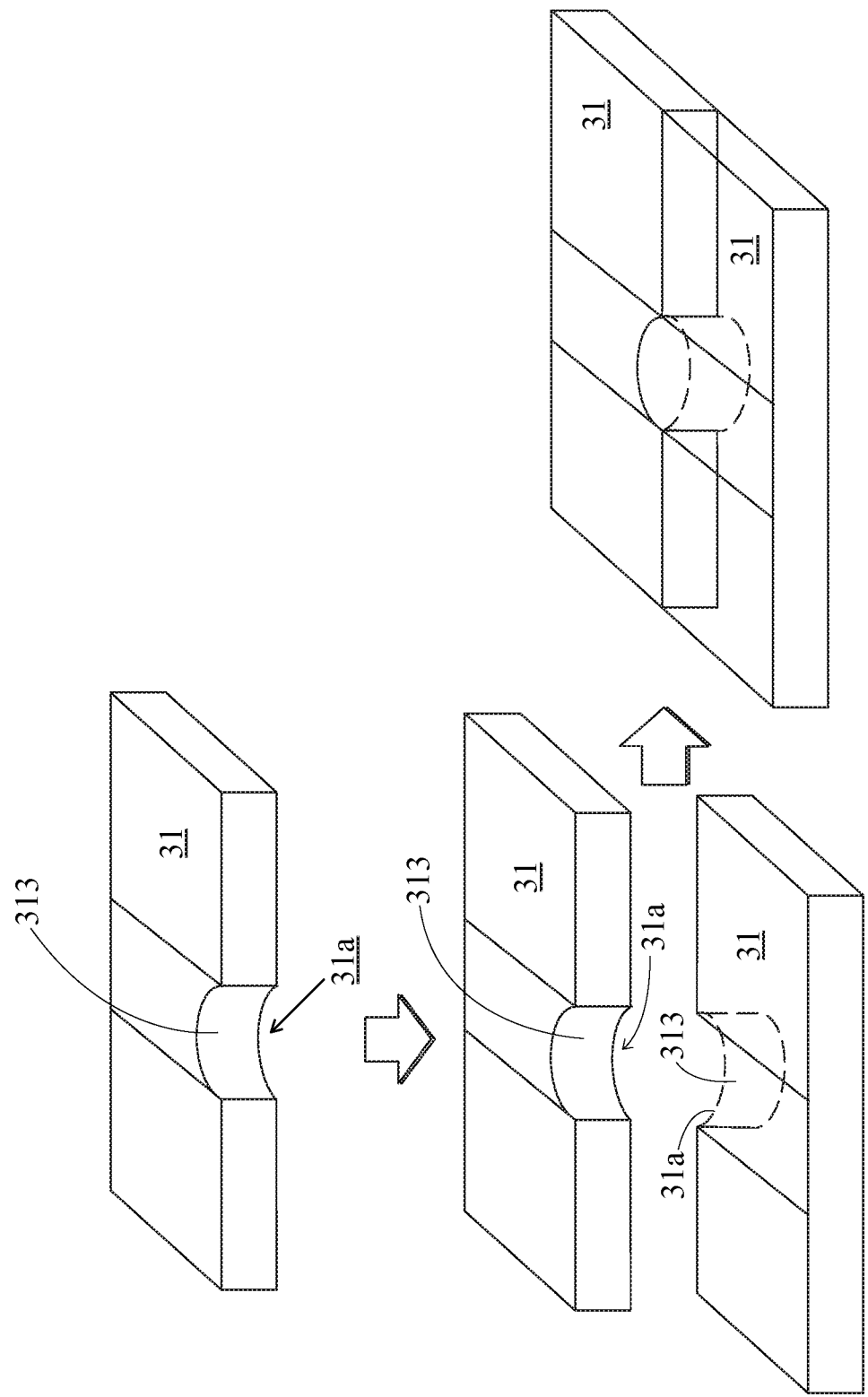
FIG. 16 is the schematic view illustrating an electrical connection process used for assembling the circuit boards in accordance with the second embodiment.
Figure 17:
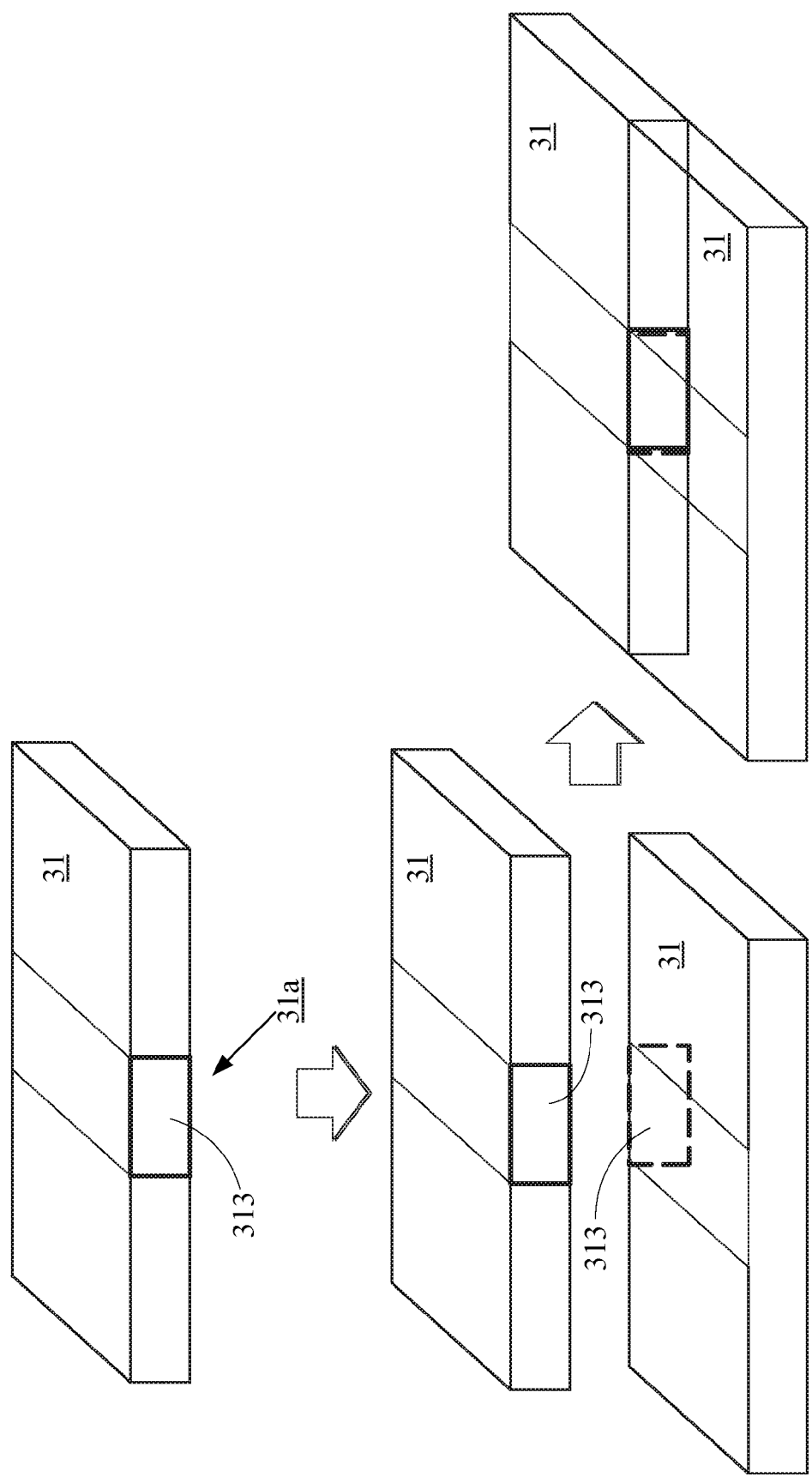
FIG. 17 is the schematic view illustrating another electrical connection process used for assembling the circuit boards of the second embodiment.

In FIG. 16, an electrical connection process used for assembling the circuit boards 31 is illustrated. The substrate 11a of each of the circuit boards 31 is formed with a plurality of cylindrical recesses 31a at the contact pads 313. The electric connection between the circuit boards 31 is established by soldering their contact pads 313 with solder formed in the cylindrical recesses 31a when the circuit board 31 is assembled with the other circuit boards 31. The portion of the contact pads 313 is formed of Cu foil. Similarly, FIG. 17 is the schematic view illustrating another electrical connection process between the circuit boards 31 of the second embodiment, where the electric connection between the circuit boards 31 is also established by soldering their contact pads 313 with solder and the portion of the contact pads 313 is formed of Cu foil. However, the circuit boards 31 are not formed with cylindrical recesses 31a at the contact pads 313.

Figure 18:
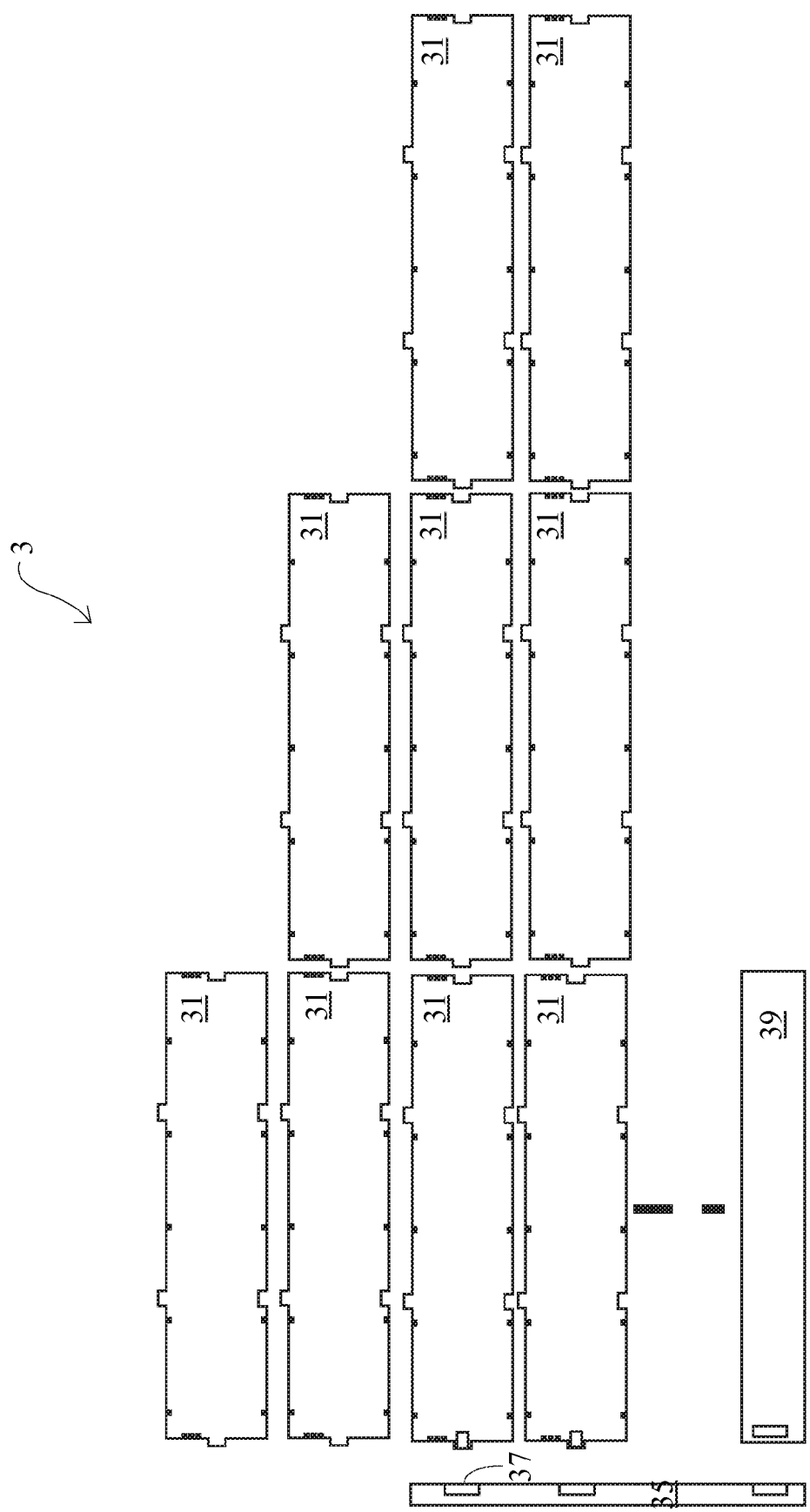
FIG. 18 is the schematic view illustrating the assembling of the lighting device of the second embodiment.
Figure 19:
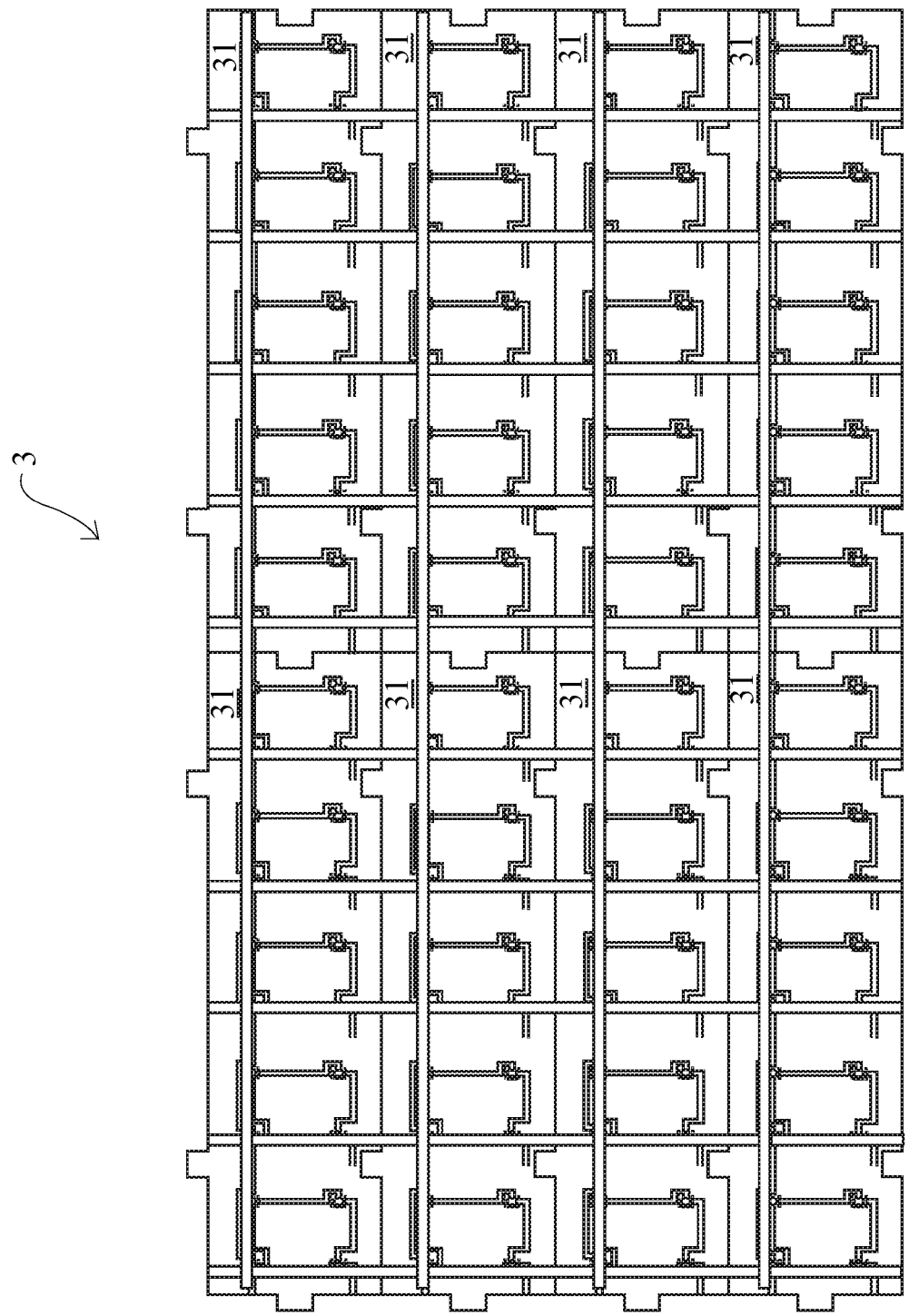
FIG. 19 is the schematic view illustrating the circuitry of the lighting panel of the lighting device of the second embodiment.

In FIG. 18 illustrates the lighting device 3 of the second embodiment comprising a plurality of rows of the circuit boards 31 and a plurality of columns of the circuit boards 31 assembled together. FIG. 19 is the schematic view illustrating the circuitry of the lighting panel of the lighting device 3 of the second embodiment.

Figure 20B:
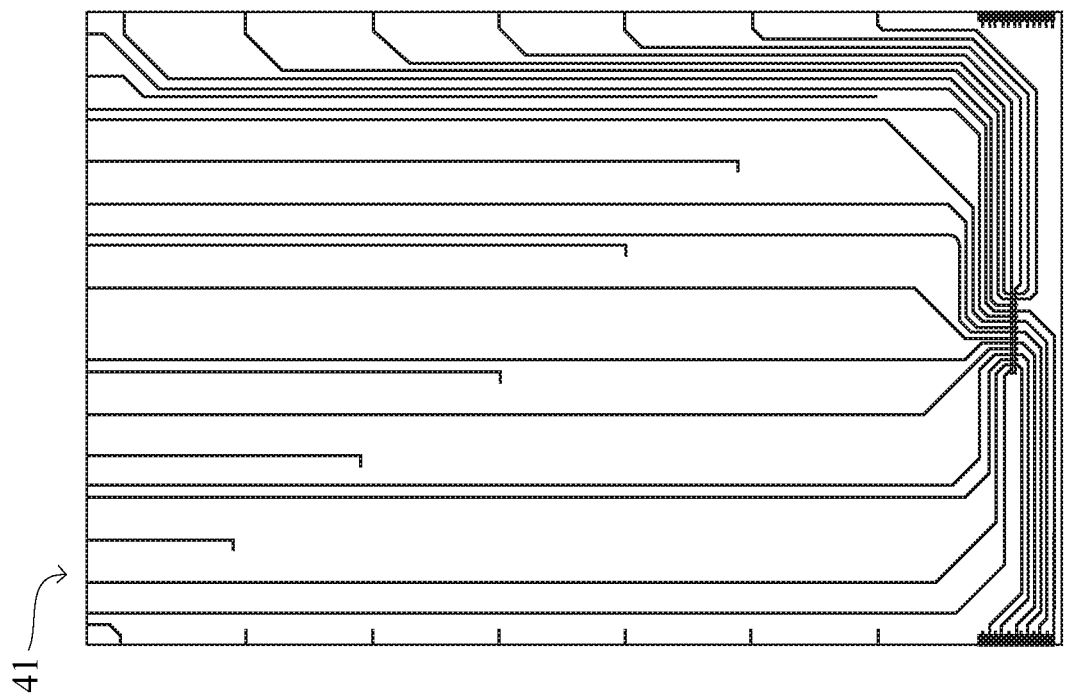
FIGS. 20A and 20B are the top view and bottom view illustrating respectively one of the circuit boards of the lighting device of a third embodiment.
Figure 20A:
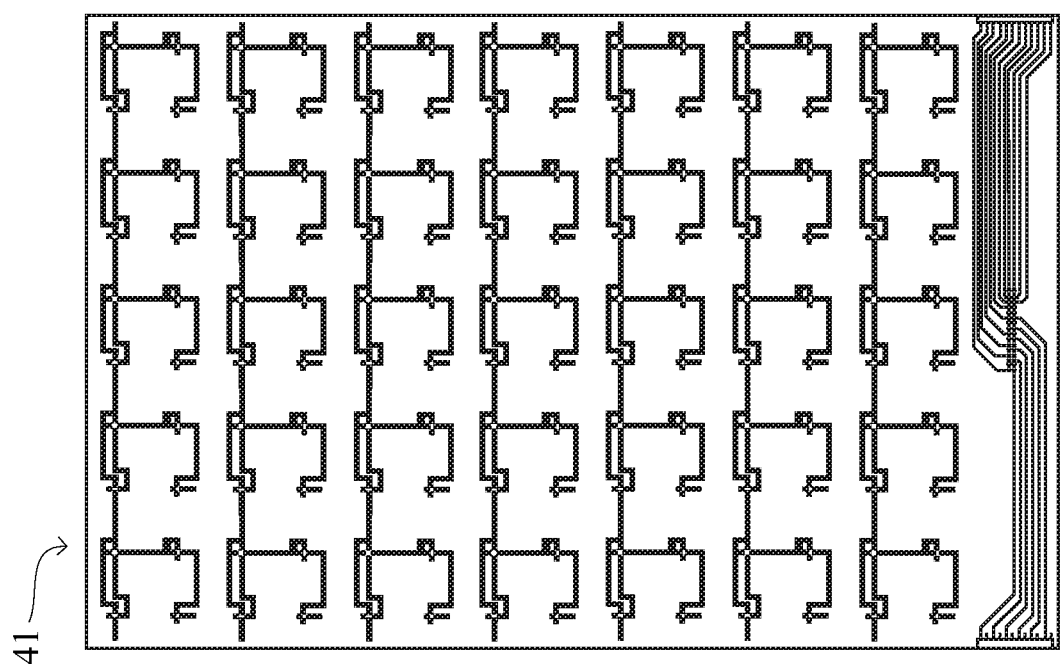
Figure 21:
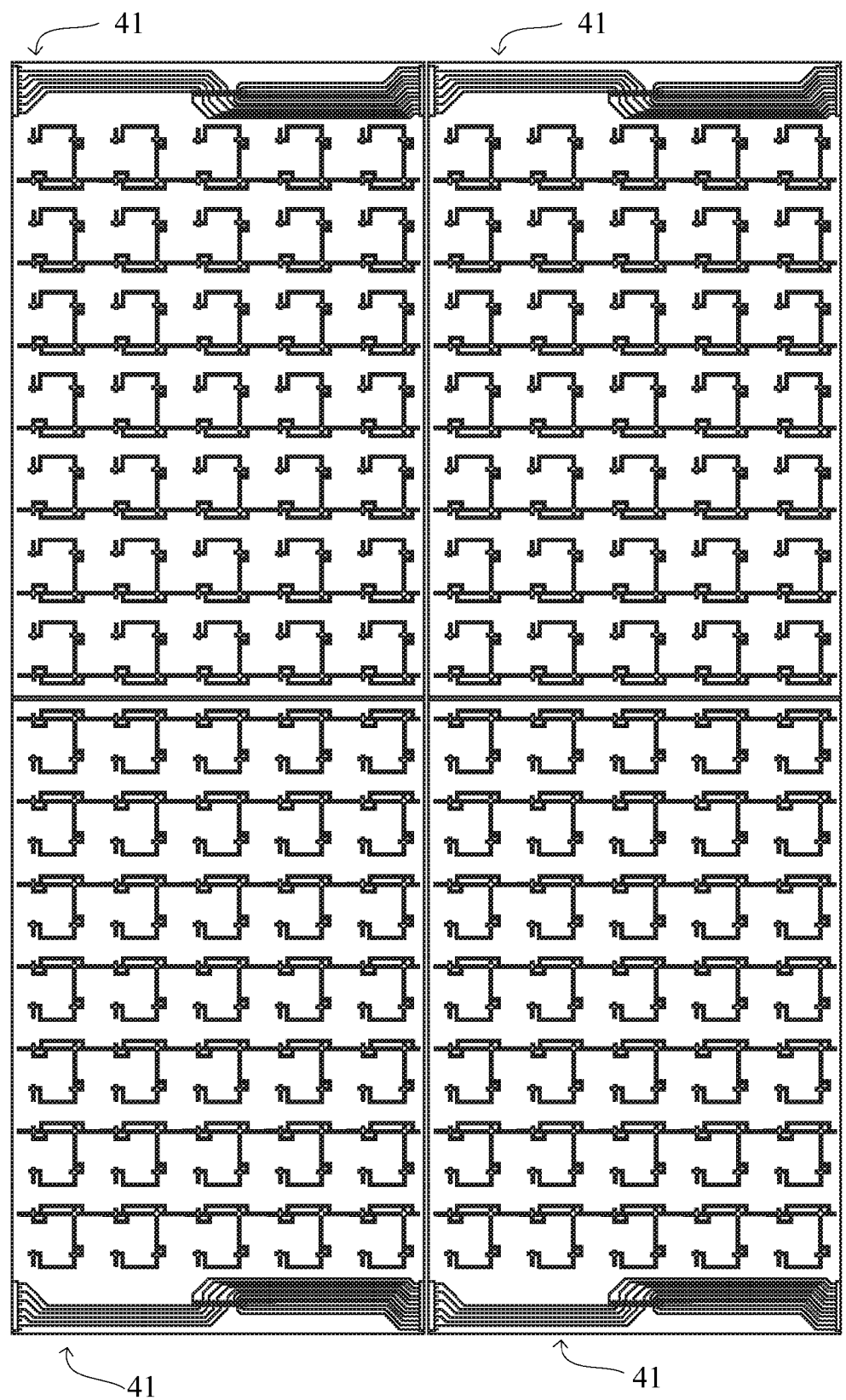
FIG. 21 is the top view illustrating the lighting panel of the lighting device of the third embodiment.

FIGS. 20A and 20B are the top view and bottom view illustrating the circuit board 41 of the lighting device in accordance with the third embodiment. In this embodiment, each of the circuit boards 41 may be disposed with light sources disposed into a 5-by-7 array. The circuit layers of each of the circuit boards 41 are patterned onto the top surface and the bottom surface of the substrate 11a to form a plurality of traces for electrically connecting the light sources disposed on the top surface. Furthermore, as shown in FIG. 21, four the circuit boards 41 are assembled together. Other detailed structures of the lighting device in the third embodiment are similar to those of the second embodiment and, thus, will not be further described herein.

Given the above, the direct-type lighting device suitable for large-scale product application is disclosed. The lighting device is able to have an unlimited size panel by assembling a plurality of the circuits boards and is able to selectively control the LED dice through the traces of the circuits board, thus to provide local dimming features.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:
1. A circuit board, comprising:
   a substrate; and
   a plurality of light sources disposed on the substrate;
   at least one circuit layer, being patterned onto the substrate to form a plurality of traces for electrically connecting the light sources;

wherein the circuit board is configured to be assembled with a plurality of other circuit boards to construct a lighting panel;

wherein the substrate comprises at least one tenon and at least one mortise to assemble the circuit board with the other circuit boards by jointing the at least one tenon and the at least one mortise of the circuit board into the at least one mortise and the at least one tenon of the other circuit boards, respectively.

2. The circuit board as claimed in claim 1, wherein each of the light sources has a power terminal and a ground terminal, the light sources are disposed into an array, and the light sources laid in a same row are electrically connected to each other at the power terminals and the light sources laid in a same column are electrically connected to each other at the ground terminals, or the light sources laid in a same row are electrically connected to each other at the ground terminals and the light sources laid in a same column are electrically connected to each other at the power terminals.

3. The circuit board as claimed in claim 1, wherein the substrate is a printed circuit board (PCB) or a flexible printed circuit board (FPC).

4. The circuit board as claimed in claim 1, wherein the at least one circuit layer is made of Cu, Ag, Ni, Au or Al.

5. The circuit board as claimed in claim 1, wherein the circuit board further comprises a plurality contact pads formed on a left side, a right side, an up side and a down side of the substrate to electrically connect to the at least one circuit layer via the traces, and the contact pads of the circuit board are electrically connected to corresponding contact pads of the other circuit boards when the circuit board is assembled with the other circuit boards.

6. The circuit board as claimed in claim 5, wherein the substrate is formed with a plurality of cylindrical recesses at the contact pads, and solder is formed in the cylindrical recesses when the circuit board is assembled with the other circuit boards.

7. The circuit board as claim in claim 5, wherein the contact pads are formed of Cu foil.

8. The circuit board as claim in claim 1, wherein the substrate comprises a top surface and a bottom surface, the circuit layers are patterned onto the top surface and the bottom surface of the substrate, and the light sources disposed on the top surface.

9. The circuit board as claim in claim 1, wherein the light sources are light emitting diodes.

10. A lighting panel, comprising a plurality of the circuit boards as claimed in claim 1, wherein the circuit boards are assembled into an N×M array.

11. The lighting panel as claimed in claim 10, wherein each of the light sources has a power terminal and a ground terminal, the light sources are disposed into an array, and the light sources laid in a same row are electrically connected to each other at the power terminals and the light sources laid in a same column are electrically connected to each other at the ground terminals, or the light sources laid in a same row are electrically connected to each other at the ground terminals and the light sources laid in a same column are electrically connected to each other at the power terminals.

12. A lighting device, comprising:
a lighting panel comprising a plurality of the circuit boards as claimed in claim 1, in which the circuit boards are assembled into an N×M array; and
a controller electrically connected to the lighting panel to individually control the light sources.

13. The lighting device as claimed in claim 12, wherein each of the light sources has a power terminal and a ground terminal, the light sources are disposed into an array, and the light sources laid in a same row are electrically connected to each other at the power terminals and the light sources laid in a same column are electrically connected to each other at the ground terminals, or the light sources laid in a same row are electrically connected to each other at the ground terminals and the light sources laid in a same column are electrically connected to each other at the power terminals.

14. The lighting device as claimed in claim 12, wherein the lighting device further comprises at least one bar and a plurality of connectors disposed on the at least one bar, and the controller is electrically connected to the lighting panel via the connectors.

15. The lighting device as claimed in claim 14, wherein the lighting device comprises two the bars assembled at two side of the lighting panel.

16. The lighting device as claimed in claim 12, wherein each of the circuit boards further comprises a plurality contact pads formed on a left side, a right side, an up side and a down side of the substrate to electrically connect to the at least one circuit layer via the traces, and the contact pads of each of the circuit board are electrically connected to corresponding contact pads of the other circuit boards.

17. The lighting device as claimed in claim 12, wherein the lighting device further comprises a plurality of light spreading plates disposed on the lighting panel for spreading light emitting from the light sources.

18. The lighting device as claim in claim 12, wherein the light sources are light emitting diodes.

* * * * *